US009466656B2

(12) United States Patent
Xiong et al.

(10) Patent No.: US 9,466,656 B2
(45) Date of Patent: Oct. 11, 2016

(54) ORGANIC LIGHT EMITTING DIODE DISPLAY PANEL, ORGANIC LIGHT EMITTING DIODE DISPLAY DEVICE, AND METHOD FOR FABRICATING ORGANIC LIGHT EMITTING DIODE DISPLAY PANEL

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Chang-ho Tseng, Shanghai (CN); Dong Qian, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/591,913

(22) Filed: Jan. 7, 2015

(65) Prior Publication Data

US 2015/0372072 A1  Dec. 24, 2015

(30) Foreign Application Priority Data

Jun. 23, 2014 (CN) .......................... 2014 1 0284218

(51) Int. Cl.
*H01L 27/32* (2006.01)
*H01L 29/66* (2006.01)
*H01L 29/786* (2006.01)

(52) U.S. Cl.
CPC ..... *H01L 27/3279* (2013.01); *H01L 29/66742* (2013.01); *H01L 29/786* (2013.01)

(58) Field of Classification Search
CPC ........................ H01L 27/3248; H01L 27/3262
See application file for complete search history.

(56) References Cited

U.S. PATENT DOCUMENTS

| 8,619,227 B2* | 12/2013 | Kimura | ............. G02F 1/134363 |
|---|---|---|---|
| | | | 349/114 |
| 2003/0127650 A1* | 7/2003 | Park | ..................... H01L 27/3244 |
| | | | 257/72 |

(Continued)

FOREIGN PATENT DOCUMENTS

| CN | 102955308 A | 3/2013 |
|---|---|---|
| CN | 103380660 A | 10/2013 |

(Continued)

OTHER PUBLICATIONS

First Office Action as received in corresponding Chinese Application No. 201410284218.4, dated Jun. 2, 2016.

*Primary Examiner* — Mohammad Islam
*Assistant Examiner* — Ankush Singal
(74) *Attorney, Agent, or Firm* — Alston & Bird LLP (57) ABSTRACT

An organic light emitting diode (OLED) display panel is disclosed. The display panel includes a substrate, and a Thin-film Transistor (TFT) disposed on the substrate. The TFT includes a source electrode, and a drain electrode. The display panel also includes a power line disposed above the substrate, an auxiliary electrode electrically connected to the power line, and a signal input terminal, electrically connected to the power line and providing an input signal. A first collective portion of the auxiliary electrode and the power line has a first length and a first resistance. A second collective portion of the auxiliary electrode and the power line has a second length and a second resistance. The first collective portion is between the second collective portion and the signal input terminal. The first length is equal to the second length, and the first resistance is greater than the second resistance.

19 Claims, 8 Drawing Sheets

(56) References Cited

U.S. PATENT DOCUMENTS

| | | | | |
|---|---|---|---|---|
| 2007/0126969 | A1* | 6/2007 | Kimura | G02F 1/134363 349/141 |
| 2007/0267648 | A1* | 11/2007 | Hwang | H01L 27/3276 257/99 |
| 2008/0006903 | A1* | 1/2008 | Akimoto | H01L 23/5256 257/529 |
| 2008/0231175 | A1* | 9/2008 | Sung | H01L 51/5237 313/504 |
| 2009/0179831 | A1* | 7/2009 | Yamashita | G09G 3/3233 345/76 |
| 2011/0140113 | A1* | 6/2011 | Park | H01L 27/1214 257/59 |
| 2011/0157122 | A1* | 6/2011 | Tsai | H01L 27/3279 345/211 |
| 2012/0133278 | A1* | 5/2012 | Ryu | H01L 27/3276 313/512 |
| 2012/0146487 | A1* | 6/2012 | Kim | H01L 27/3276 313/504 |
| 2012/0162275 | A1* | 6/2012 | Park | H01L 27/3262 345/690 |
| 2013/0037835 | A1* | 2/2013 | Lee | H01L 27/3279 257/91 |
| 2013/0320841 | A1 | 12/2013 | Shirai et al. | |
| 2014/0183479 | A1* | 7/2014 | Park | H01L 51/56 257/40 |
| 2015/0187858 | A1* | 7/2015 | Wang | H01L 27/3216 257/40 |
| 2015/0243704 | A1* | 8/2015 | Lee | H01L 51/56 257/79 |

FOREIGN PATENT DOCUMENTS

| | | |
|---|---|---|
| KR | 10-0605152 B1 | 7/2006 |
| KR | 10-0611158 B1 | 8/2006 |

* cited by examiner

ORGANIC LIGHT EMITTING DIODE DISPLAY PANEL, ORGANIC LIGHT EMITTING DIODE DISPLAY DEVICE, AND METHOD FOR FABRICATING ORGANIC LIGHT EMITTING DIODE DISPLAY PANEL

CROSS-REFERENCES TO RELATED APPLICATIONS

This application claims the benefit of priority to Chinese Patent Application No. 201410284218.4, filed with the Chinese Patent Office on Jun. 23, 2014 and entitled "ORGANIC LIGHT EMITTING DIODE DISPLAY PANEL, ORGANIC LIGHT EMITTING DIODE DISPLAY DEVICE, AND METHOD FOR FABRICATING ORGANIC LIGHT EMITTING DIODE DISPLAY PANEL", the content of which is incorporated herein by reference in its entirety.

FIELD OF THE INVENTION

The present application relates to the field of display, particularly to an organic light emitting diode display panel, an organic light emitting diode display device and a method for fabricating the organic light emitting diode display panel thereof.

BACKGROUND OF THE INVENTION

In an organic light emitting diode (OLED) device, electroluminescence of organic fluorescent compounds is used instead of backlight, thereby endowing the OLED device with a small size and good portability. In addition, the OLED device further has advantages such as a wide viewing angle and a fast response.

The OLED device has a cathode, an anode, and an organic film made of an organic compound provided between the cathode and the anode. When a voltage is applied between the cathode and the anode, holes migrate, via a Hole Transport Layer (HTL), from an electrode with a positive electrical potential to an organic light emitting layer; and electrons migrate, via an Electron Transport Layer (ETL), from an electrode with a negative electrical potential to the organic light emitting layer. Excitons are generated through recombination of the holes and the electrons, and are excited to emit light, providing light for the OLED device.

BRIEF SUMMARY OF THE INVENTION

One inventive aspect is an organic light emitting diode (OLED) display panel. The display panel includes a substrate, and a Thin-film Transistor (TFT) disposed on the substrate. The TFT includes a source electrode, and a drain electrode. The display panel also includes a power line disposed above the substrate, an auxiliary electrode electrically connected to the power line, and a signal input terminal, electrically connected to the power line and providing an input signal. A first collective portion of the auxiliary electrode and the power line has a first length and a first resistance. A second collective portion of the auxiliary electrode and the power line has a second length and a second resistance. The first collective portion is between the second collective portion and the signal input terminal. The first length is equal to the second length, and the first resistance is greater than the second resistance.

Another inventive aspect is an OLED display device, including an OLED display panel. The OLED display panel includes a substrate, and a Thin-film Transistor (TFT) disposed on the substrate. The TFT includes a source electrode, and a drain electrode. The display panel also includes a power line disposed above the substrate, an auxiliary electrode electrically connected to the power line, and a signal input terminal, electrically connected to the power line and providing an input signal. A first collective portion of the auxiliary electrode and the power line has a first length and a first resistance. A second collective portion of the auxiliary electrode and the power line has a second length and a second resistance. The first collective portion is between the second collective portion and the signal input terminal. The first length is equal to the second length, and the first resistance is greater than the second resistance.

Another inventive aspect is a method for fabricating an OLED display panel. The method includes providing a substrate, forming, above the substrate, a TFT including a source electrode and a drain electrode, and forming a power line above the substrate. The method also includes forming a first electrode above the TFT, the first electrode being electrically connected to the source electrode or the drain electrode. The method also includes forming an auxiliary electrode, where a resistance per unit length of the auxiliary electrode changes along the auxiliary electrode, and where the auxiliary electrode is electrically connected to the power line. The method also includes forming an organic layer above the first electrode, and forming a second electrode above the organic layer.

DETAILED DESCRIPTION OF THE PREFERRED EMBODIMENTS

To better explain technical solutions according to embodiments of the application, clear and complete descriptions are given hereinafter in conjunction with drawings in the embodiments. Apparently, described embodiments are merely a few embodiments of the application, rather than all embodiments. Any other embodiments obtained by those skilled in the art without creative work are within the scope of the application.

Figure 1:
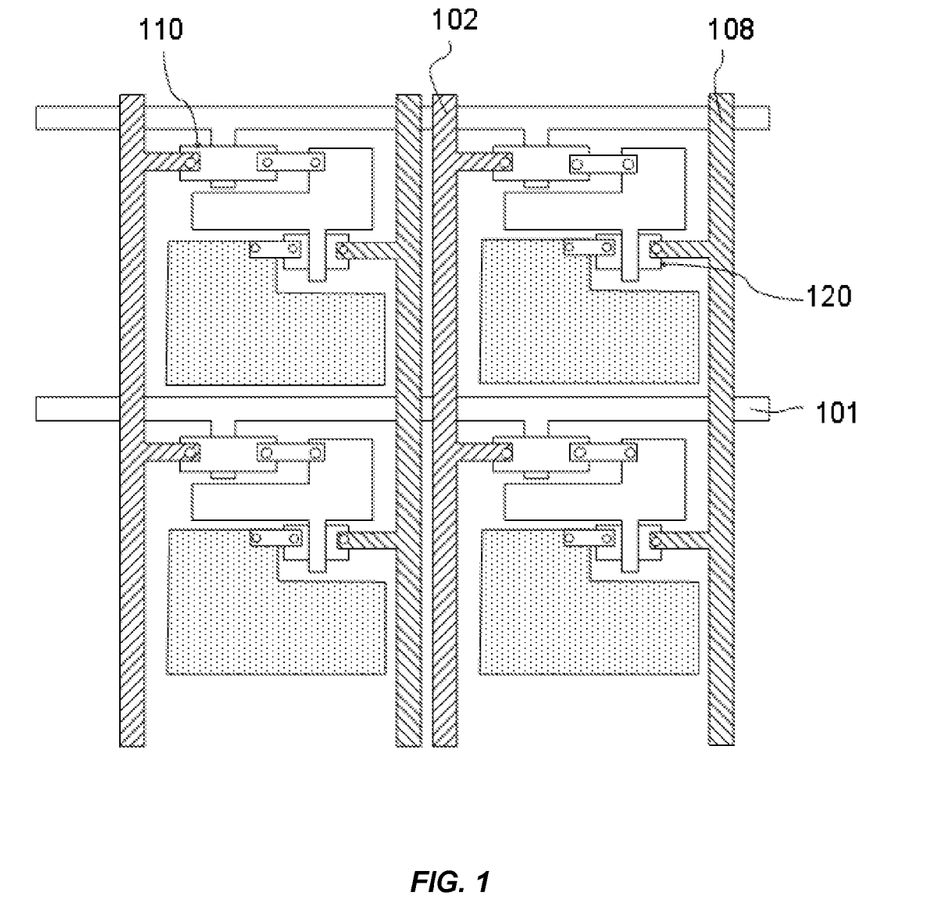
FIG. 1 is a plan view of a conventional OLED device.

FIG. 1 is a top view of a conventional OLED device. The OLED device includes multiple pixels. Pixel units are defined by intersections of gate lines 101 and data lines 102, and the gates lines 101 are insulated from the data lines 102. Power lines 108 are disposed in parallel with the data lines 102. Each pixel unit includes at least two thin film transistors (TFTs). As shown in FIG. 1, numerical symbol 110 represents a switch TFT and numerical symbol 120 represents a driving TFT. The switch TFT 110 receives a signal transmitted via the gate line 101, to control a switch to forward a signal transmitted via the data line 102 to the driving TFT 120. The driving TFT further controls an intensity of a current input to an OLED element via the power line 108. In general, the OLED device may further include one or more storage capacitors (not shown in FIG. 1) to store data signals transmitted by the switch TFT 110.

Figure 2:
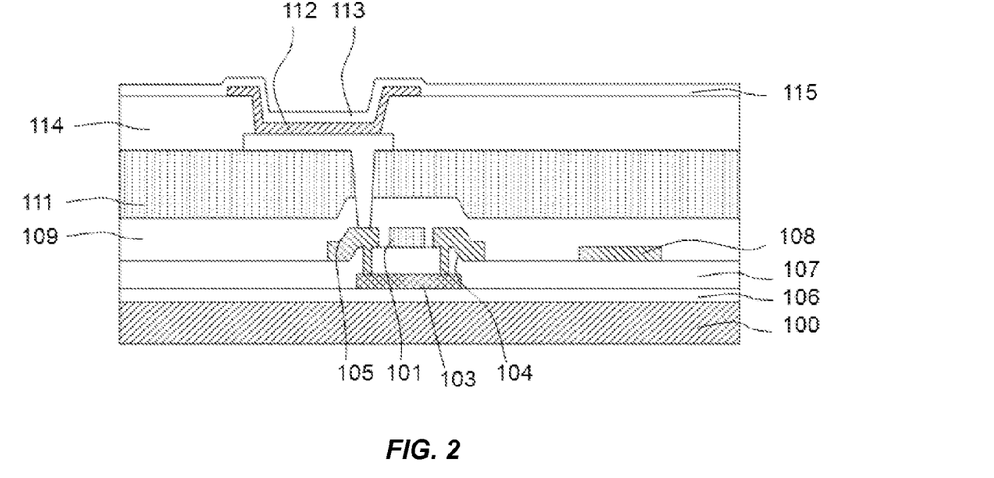
FIG. 2 is a sectional view of a pixel of the conventional OLED device.

FIG. 2 is a sectional view of a pixel of the conventional OLED device. A buffer layer 106 is disposed on a substrate 100. An active layer 103 is disposed on the buffer layer 106. A gate insulation layer 107 is provided over the active layer 103. A gate electrode 101 is arranged on the gate insulation layer 107, and a source electrode 104 and a drain electrode 105 are insulatively arranged at two sides of the gate electrode 101 and are located on the gate insulation layer 107. The source electrode 104 and the drain electrode 105 are electrically connected to the active layer 103 via holes penetrating through the gate insulation layer 107. The power line 108 is provided on the gate insulation layer 107. A passivation film 109 and a planar film 111 are disposed above the TFT. A first electrode 112 is disposed on the planar film 111, and the first electrode 112 is electrically connected to the drain electrode 105. A pixel defining layer 114 is disposed over the first electrode 112. The pixel defining layer 114 has a sunken area, and an organic layer 113 is disposed at the sunken area. In general, the organic layer 113 may include an HTL, a hole injection layer, a light emitting layer, an ETL, and an electron injection layer. The organic layer 113 may be disposed at the sunken area of the pixel defining layer 114, or disposed on an entire surface of the pixel defining layer 114.

Figure 3:
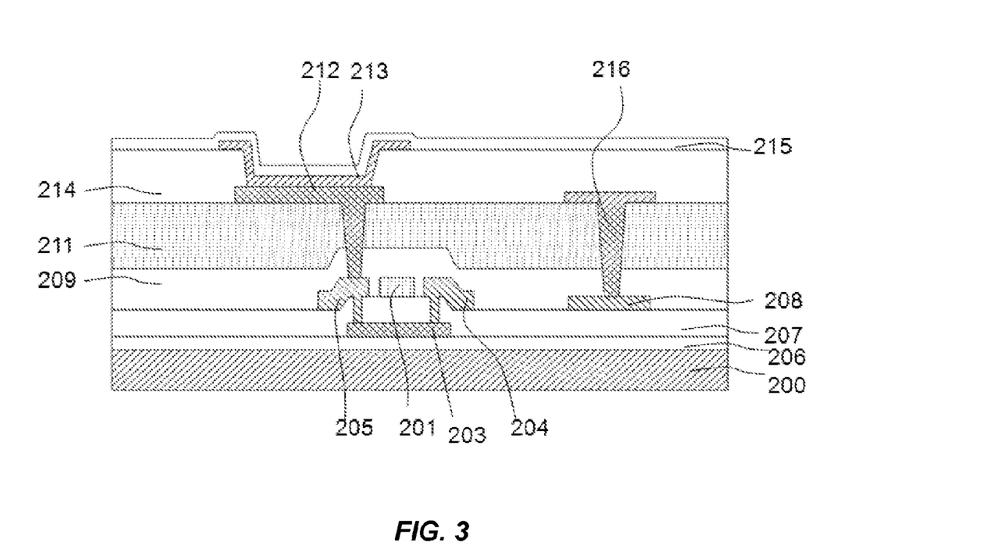
FIG. 3 is a sectional view of a pixel of an OLED display panel according to an embodiment of the application.

FIG. 3 is a sectional view of a pixel of an OLED display panel according to an embodiment of the application. Similarly, the OLED display panel according to the embodiment of the application includes a substrate 200, a buffer layer 206, an active layer 203, a gate electrode 201, a source electrode 204, a drain electrode 205, a gate insulation layer 207, a power line 208 arranged at a same layer as the drain electrode 205 and the source electrode 204, a passivation film 209, a planar film 211, a first electrode 212, an organic layer 213 and a pixel defining layer 214. The arrangement of the above components and electrical connections between the above components are same as those in the conventional OLED device, and may be referred to the description of the conventional OLED device. In a conventional design, voltage drop is generated along the power line due to the resistance of the power line, and the voltage drop aggravates at a place far away from a signal input terminal. The voltage drop results in a nonuniform brightness and a poor display effect. The OLED device provided in the application further includes an auxiliary electrode 216, and the auxiliary electrode 216 is electrically connected to the power line 208. A total resistance of the auxiliary electrode 216 and the power line 208 electrically connected to each other is decreased, thereby alleviating the voltage drop. Under a basis that the auxiliary electrode is electrically connected with the power line and the total resistance is decreased, the auxiliary electrode may be fabricated in any of the layers, or may be fabricated into a separate layer, or the auxiliary electrode and other components may be fabricated in a same layer. Optionally, the auxiliary electrode 216 and the first electrode 212 may be fabricated in a same layer. Optionally, the auxiliary electrode 216 and the first electrode 212 may be made of a same material and fabricated with a same process of etching; hence, no additional process is required to form the auxiliary electrode. Optionally, the auxiliary electrode may be located above the power line, and in this case, an aperture ratio of the device may not be affected because the auxiliary electrode is located in a non-display region.

Since the voltage drop aggravates as a distance from the signal input terminal increases, the auxiliary electrode in the application may be designed into an uneven shape to better compensate the power line. Optionally, for two portions of a combination of the auxiliary electrode and the power line, each portion having a first length, the resistance of a portion far from the signal input terminal is less than the resistance of a portion close to the signal input terminal. With the uneven design, a portion of the power line, having a heavy voltage drop, is connected in parallel with a resistor having a small resistance, to effectively alleviate the voltage drop at the portion of the power line, and the voltage drop along the power line is small due to the resistance compensation. The above effects may be achieved by adjusting the size, the shape or the resistivity of the auxiliary electrode, or may be achieved by adjusting the size, the shape, or the resistivity of the power line. Optionally, the resistance per unit length of the auxiliary electrode decreases as a distance from the per unit length of the auxiliary electrode to the signal input terminal increases.

Figure 4:
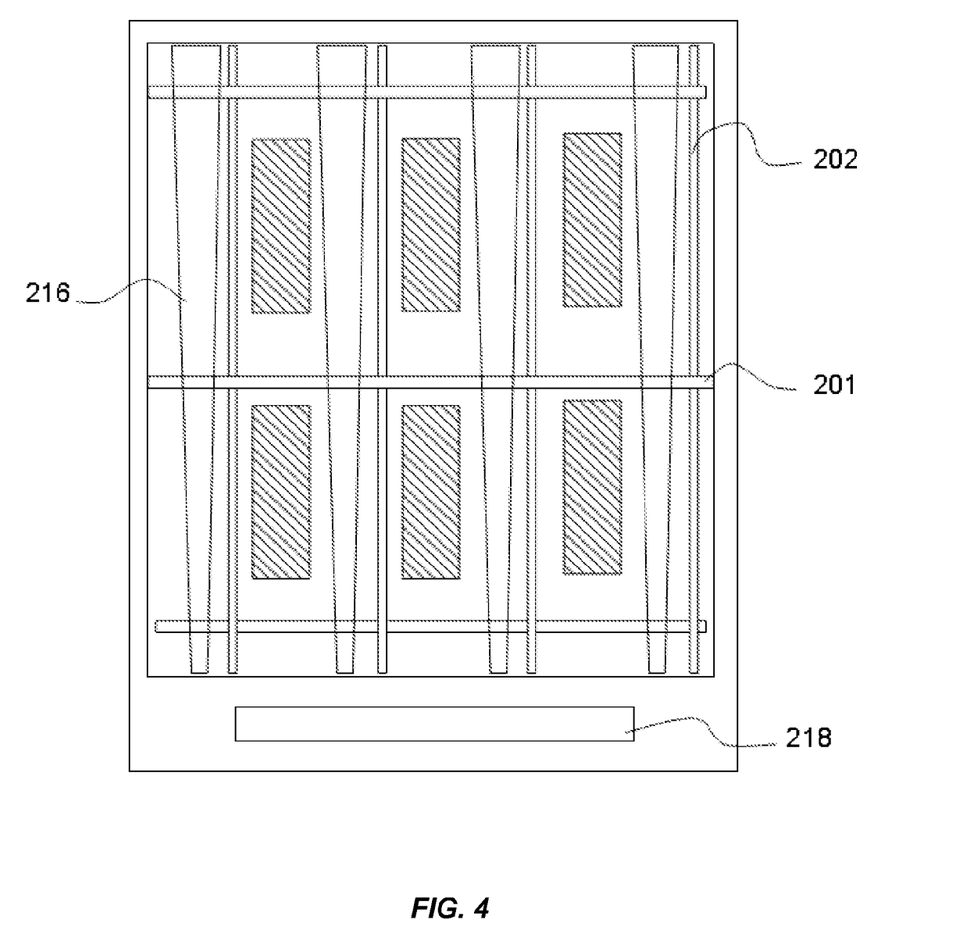
FIG. 4 is a plan view of an OLED display panel according to an embodiment of the application.

FIG. 4 is a top view of an OLED display panel according to an embodiment of the application. Pixel units are defined by intersections of gate lines 201 and data lines 202, and the gate lines 201 are insulated from the data lines 202. Auxiliary electrodes 216 are parallel with the data lines 202, and are electrically connected to power lines (not shown in FIG. 4) to collaboratively transmit an electrical signal emitted from a signal input terminal 218. The signal input terminal 218 may be an integrated circuit, transmitting the electrical signal to the power lines to control a brightness of the OLED display panel. In general, the signal input terminal 218, i.e., the integrated circuit is electrically connected to a fabricated display panel, to control displaying of the panel by inputting the signal. According to an embodiment, the resistance per unit length of the combination of the auxiliary electrode and the power line gradually decreases as a distance from the per unit length of the combination to the signal input terminal increases. The width of per unit length of the auxiliary electrode 216 gradually increases as a distance from the per unit length of auxiliary electrode 216 to the signal input terminal 218 increases. With this design, the resistance of the per unit length of the auxiliary electrode 216 gradually decreases as the distance from the per unit length of the auxiliary electrode 216 to the signal input terminal increases, and consequently, a portion of the power line far from the signal input terminal is provided with a large compensation, thus effectively compensating the voltage drop at a place far from the signal input terminal, and alleviating the problem of nonuniform display. According to an embodiment, the first length mentioned above may be any length larger than zero and less than a total length of the auxiliary electrode. In fact, alternatively, a compensation for alleviating the voltage drop may be achieved by an uneven design of the power line. According to the application, optionally, the width of the auxiliary electrode is larger than the width of the power line, and the voltage drop along the power line may be reduced more effectively by this design. In general, the wider the auxiliary electrode, the smaller the resistance of the auxiliary electrode, and the better the compensation for the voltage drop along the power line. Therefore, in the application, under a premise that no short circuit may occur between the auxiliary electrode and other electrodes and the display effect may not be affected, the auxiliary electrode may be made as wide as possible.

Compared with adjusting the shape of the power line, the technical solution of the application has advantages as follows. Only the first electrode is located in a same layer as the auxiliary electrode, while many components are located in a same layer as the power line. Therefore, if any adjustment is made to the shape of the power line, the components and the power line, located in a same layer, may influence each other, thereby affecting the display effect. However, in the application, with an adjustment made to the shape of the auxiliary electrode, a compensation for resistance is achieved without affecting the display effect, and the process is also easier to operate.

Figure 5:
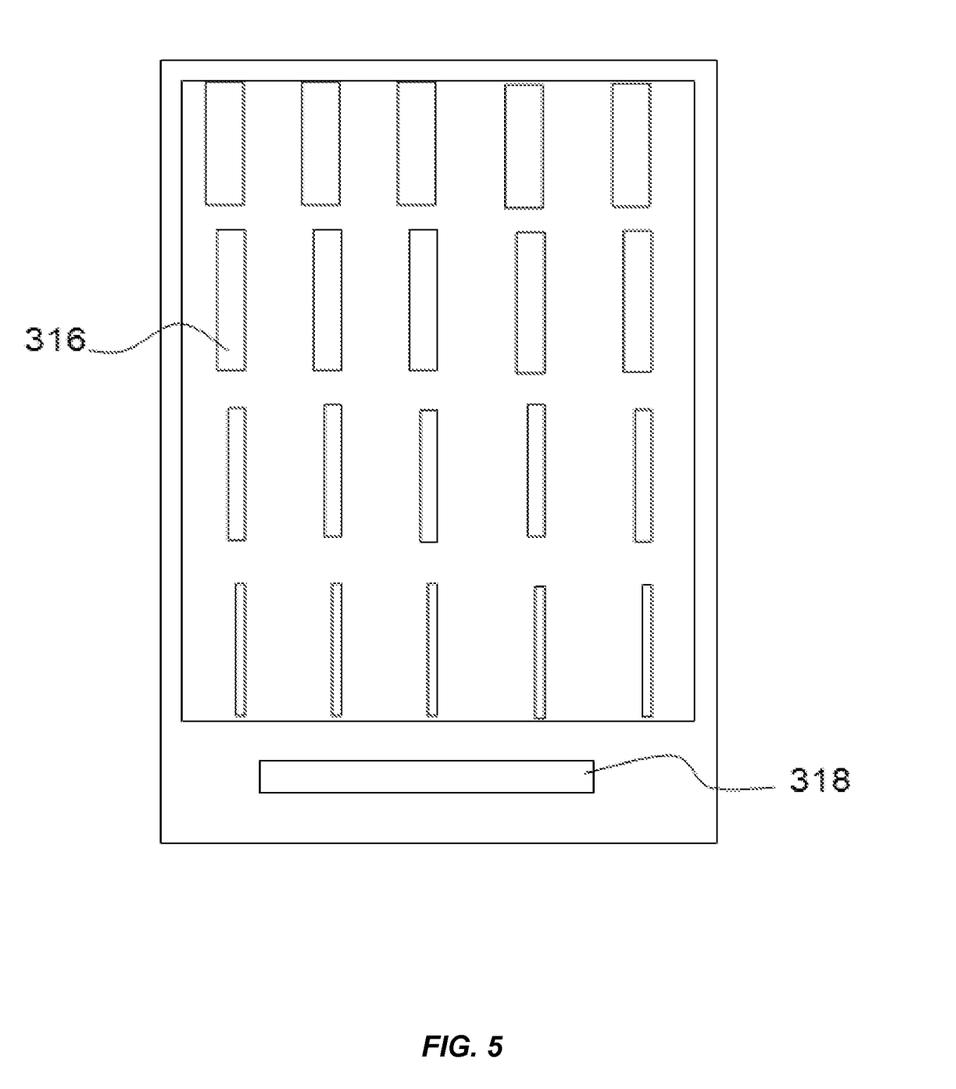
FIG. 5 is a plan view of an OLED display panel according to an embodiment of the application.

According to other embodiments of the application, the uneven design of the auxiliary electrode may further have other implementations. FIG. 5 is a top view of an OLED display panel according to an embodiment of the application. As shown in FIG. 5, each auxiliary electrode 316 includes multiple discrete sub-auxiliary electrodes. The farther one sub-auxiliary electrode is away from a signal input terminal 318, the larger the width of the sub-auxiliary electrode is. According to an embodiment, the first length mentioned above is a length larger than the sum of the length of the sub-auxiliary electrode and a distance between sub-auxiliary electrodes. In the discontinuous design and along a direction departing from the signal input terminal, for any two portions of a combination of the auxiliary electrode and the power line, each portion having the first length, a resistance of one portion differs from a resistance of the other portion. Optionally, the length of each sub-auxiliary electrode is larger than a distance between two adjacent scan lines; accordingly, an electrical signal may be transmitted more effectively. With the discontinuous arrangement, total resistances at places with different distances from the signal input terminal can be consistent and the voltage drop is alleviated. Furthermore, in some designs of panels, patterns may be arranged at places of the auxiliary electrodes. Herewith the discontinuous arrangement, the routing on the panel may not be affected.

Figure 6:
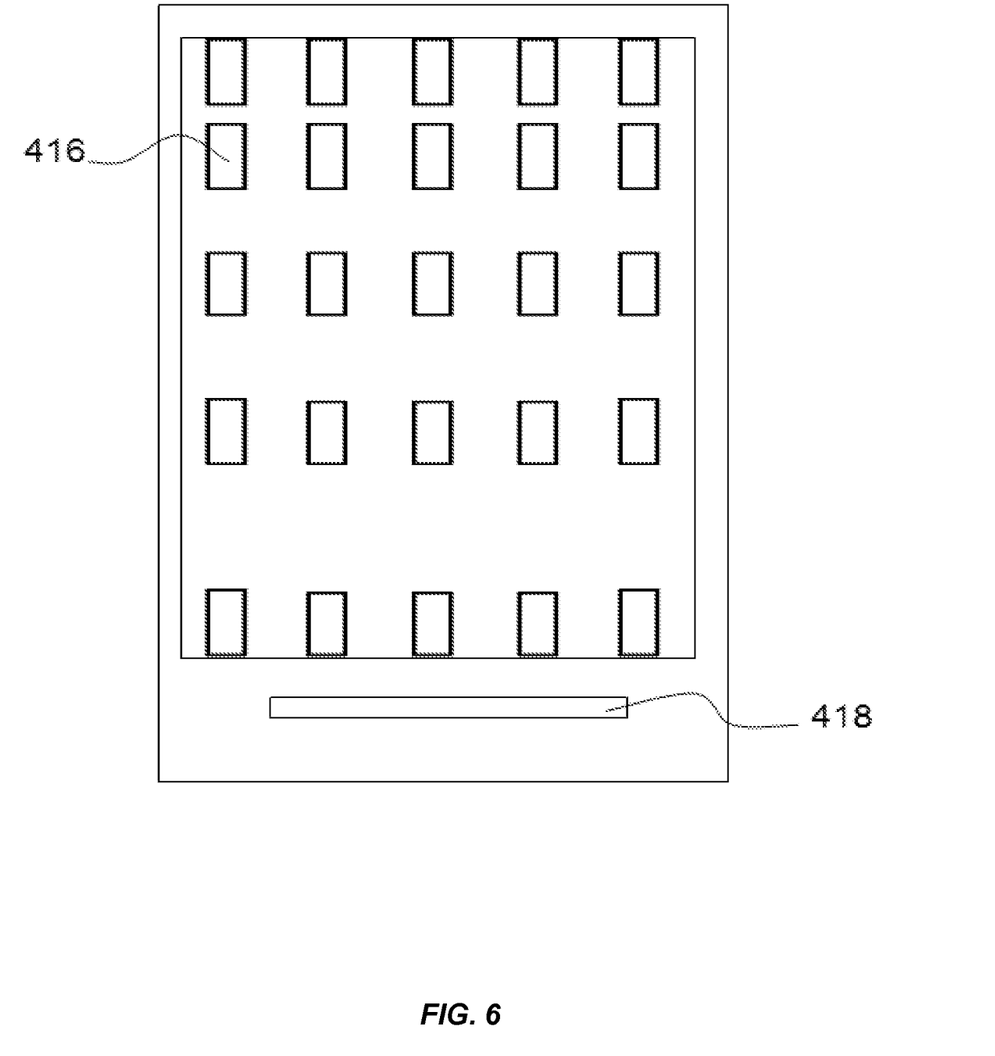
FIG. 6 is a plan view of an OLED display panel according to an embodiment of the application.

FIG. 6 is a top view of an OLED display panel according to an embodiment of the application. Each auxiliary electrode 416 includes multiple discrete sub-auxiliary electrodes. As a distance from a signal input terminal 418 increases, distances between the respective sub-auxiliary electrodes gradually decrease, and widths of the sub-auxiliary electrodes may be same with each other or may gradually increases. With the discontinuous arrangement, resistances at places with different distances from the signal input terminal are consistent and the voltage drop is alleviated. Furthermore, in some designs of panels, routing may be arranged at places of the auxiliary electrodes. Here with the discontinuous arrangement, the routing on the panel may not be affected. It should be noted that, for clarifying structures of the display panel, data lines and gate lines are not shown in FIG. 5 and FIG. 6, and detailed structures may be referred to FIG. 4.

According to an embodiment of the application, the auxiliary electrode may be made of materials with different resistivities. In particular, the auxiliary electrode may be made of multiple types of materials. A portion of the auxiliary electrode far from the signal input terminal is made of a material having a small resistivity, and a portion of the auxiliary electrode close to the signal input terminal is made of a material having a large resistivity; hence, an effective compensation for the power line is achieved. Alternatively, the auxiliary electrode may be made of a single type of material. Optionally, as a distance from the signal input terminal increases, different concentrations of impurity are doped into the single type of material to implement a gradually changed resistance along the auxiliary electrode. For example, the conductivity of Indium Tin Oxide (ITO) may be changed by doping, into the ITO, one or more kinds of metallic elements such as Ta, Nd and Sn, and an uneven change of the resistivity of a host material ITO may be achieved by doping different concentrations of metallic elements at different portions of the auxiliary electrode. It should be noted that, the resistivity of the material may gradually decrease as the distance from the signal input terminal increases. Alternatively, the auxiliary electrode may include multiple segments, the resistivity maintains the same within each segment, while the resistivities of respective segments decrease as distances from the respective segments to the signal input terminal increase.

In addition, other shapes or methods may be applied to ensure that a portion far away from the signal input terminal has a small resistance, for example, a thickness may be adjusted, or a second auxiliary electrode may be further connected in parallel with the power line. The methods given above may be used in combination, and possible combinations are all within the idea of the application and are not enumerated herein.

Figure 7:
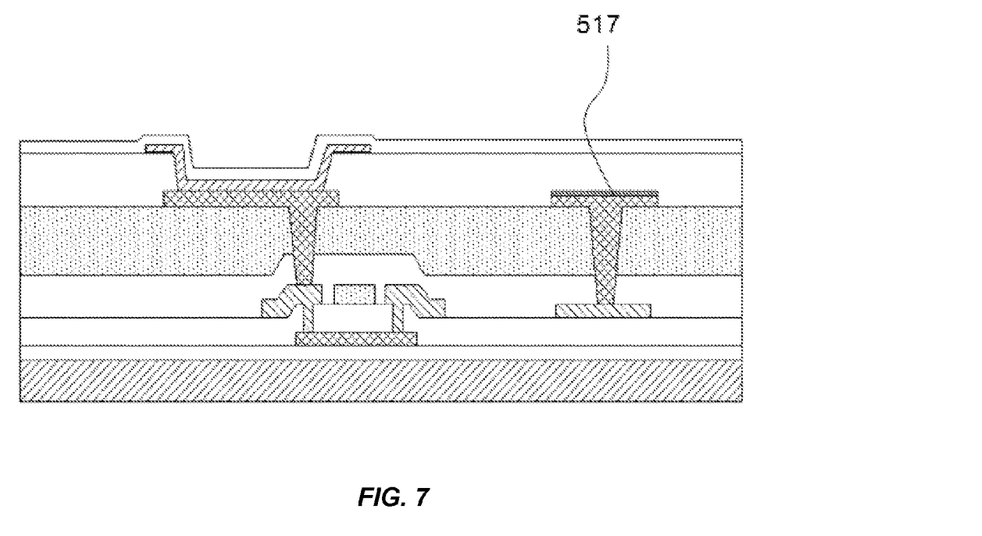
FIG. 7 is a sectional view of a pixel of an OLED display panel according to an embodiment of the application.

According to an embodiment of the application, a shielding layer 517 (as shown in FIG. 7) may be disposed on an auxiliary electrode 516. The shielding layer 517 may be made of an organic material, having a weak reflection effect or no reflection effect of light. In the case that the auxiliary electrode 516 is made of a reflective material (such as metal), an external light may be reflected by the auxiliary electrode 516, thereby decreasing a contrast of the display panel. The shielding layer may prevent the reflection of an external background light. To prevent the reflection, optionally, the auxiliary electrode 516 may be made of a material with a weak reflection effect or no reflection effect of light. With this design, the auxiliary electrode 516 may compensate the voltage drop along the power line without affecting the contrast of the display panel.

Figure 8A:
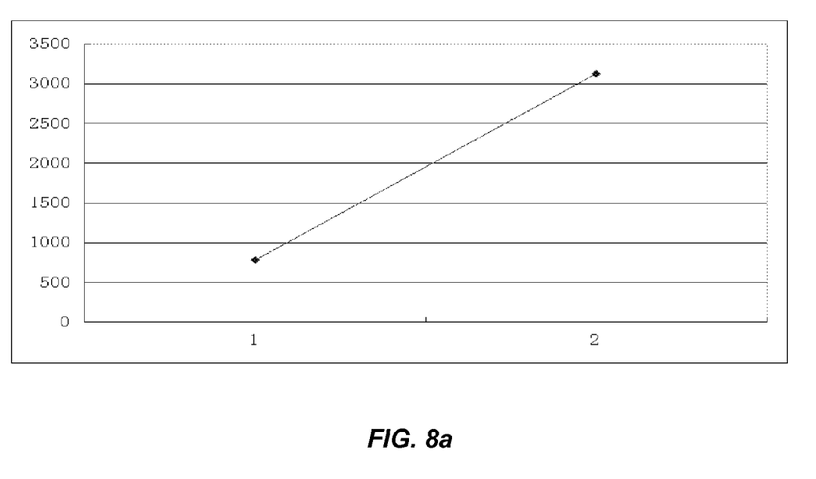
FIG. 8a-FIG. 8c show simulated values of resistances according to an embodiment of the application.
Figure 8B:
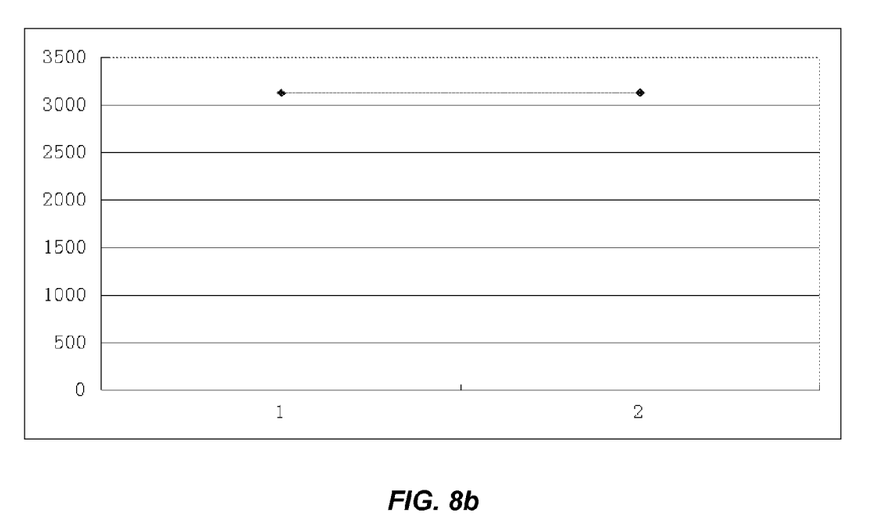
Figure 8C:
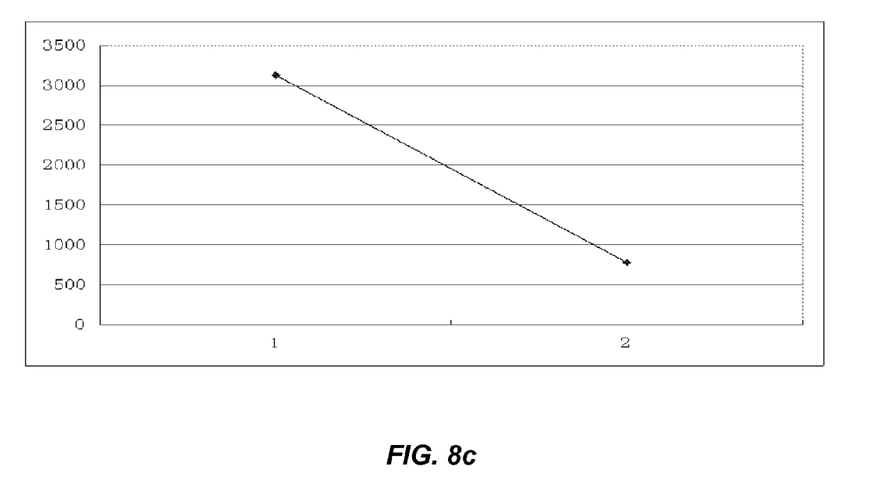

FIG. 8a-FIG. 8c illustrate simulated values of resistances of three different shapes of auxiliary electrodes in a 5.5-inch Active Matrix Organic Light Emitting Diode (AMOLED) panel. A sheet resistance is 0.56 Ω/sq. An ordinate represents the resistance of a wire. In an abscissa, numerical symbol 1 represents an end of an auxiliary electrode close to an IC terminal, numerical symbol 2 represents an end of the auxiliary electrode far away from the IC terminal, and a direction from numerical symbol 1 to numerical symbol 2 represents a direction departing from the IC terminal. In FIG. 8a, a width of the auxiliary electrode gradually decreases along the direction departing from the IC terminal, and a corresponding resistance increases from 750 Ω to 3250Ω. A compensation is weak at a place far from the IC terminal. Since a voltage drop is large at a place far from the IC terminal, this shape design of the auxiliary electrode has no significant effect in compensating the voltage drop. In FIG. 8b, a width of the auxiliary electrode keeps constant along the direction departing from the IC terminal, and a corresponding resistance is maintained at about 3200Ω. The auxiliary electrode provides a same resistance compensation to a whole power line. In fact, the voltage drop gradually aggravates along the direction departing from the IC terminal. In compensating the aggravating voltage drop with the same resistance compensation, the voltage drop at a place far from the IC terminal may not be not effectively compensated. In FIG. 8c, a width of the auxiliary electrode gradually increases along the direction departing from the IC terminal, and a corresponding resistance decreases from 3250 Ω to 750Ω. Therefore, at a place far from the IC terminal where the voltage drop is large, an effect of compensation is significant. With this design, the large voltage drop at the place far from the IC terminal is effectively compensated.

Figure 9:
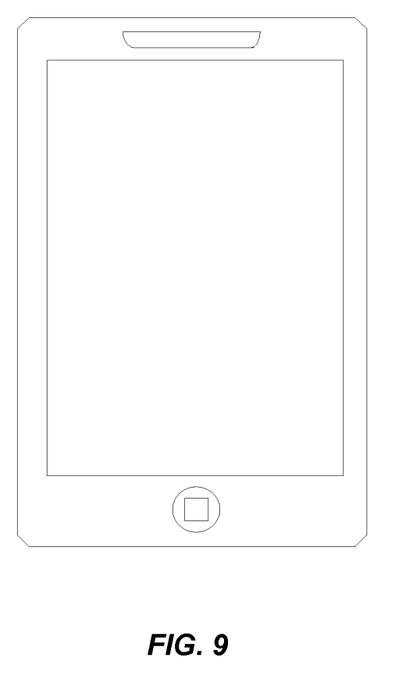
FIG. 9 is a schematic diagram of an OLED display device according to an embodiment of the application.

Referring to FIG. 9, an OLED display device including the foregoing OLED display panel is further disclosed in the application.

A method for fabricating an OLED display panel is further disclosed in the application. The method includes: providing a substrate; forming, on the substrate, an TFT including a source electrode and a drain electrode; forming a power line; forming a first electrode above the TFT, the first electrode being electrically connected to the source electrode or to the drain electrode; forming an auxiliary electrode, where resistance per unit length of the auxiliary electrode changes along the auxiliary electrode and the auxiliary electrode is electrically connected to the power line; forming an organic layer over the first electrode; and forming a second electrode above the organic layer. Optionally, the auxiliary electrode is formed in a same layer as the first electrode. Optionally, the auxiliary electrode and the first electrode are formed in a same step.

The idea of reducing the resistance of an electrode along the direction departing from the signal input terminal as described in the application is also applicable to other aspects such as designing shapes of a cathode, an anode, or an auxiliary electrode thereof in an OLED device.

In the application, the auxiliary electrode may be made into a single layer or multiple layers. The auxiliary electrode may be made of metal or ITO. Or an ITO layer may be provided over a metallic layer, such as, an Ag-ITO structure, an Al-ITO structure, or a Mo-ITO structure. The passivation film may be made of SiO2 or SiNx. The planar film may be made of an organic material such as acrylates or polymides. The active layer may be made of polysilicon.

The terminology "parallel" mentioned in the specification is not limited to completely parallel, and may be appropriately extended to a case of substantially parallel.

Apparently, various modifications and transformations may be made to the application by those skilled in the art without departing from the spirit and the scope of the application. The application intends to include any modifications and transformations within the scope of claims of the application or within equivalent technologies of the application.

What is claimed is:

1. An organic light emitting diode (OLED) display panel, comprising:
    a substrate;
    a Thin-film Transistor (TFT) disposed on the substrate, the TFT comprising:
        a source electrode, and
        a drain electrode;
    a power line, disposed above the substrate;
    an auxiliary electrode electrically connected to the power line; and
    a signal input terminal, electrically connected to the power line and providing an input signal,
    wherein a first collective portion of the auxiliary electrode and the power line has a first length and a first resistance,
    wherein a second collective portion of the auxiliary electrode and the power line has a second length and a second resistance,
    wherein the first collective portion is between the second collective portion and the signal input terminal,
    wherein the first length is equal to the second length, and
    wherein the first resistance is greater than the second resistance.

2. The OLED display panel according to claim 1, wherein a collective resistance per unit length of the auxiliary electrode and the power line decreases as distance from the signal input terminal increases.

3. The OLED display panel according to claim 1, wherein the first length is less than a total length of the auxiliary electrode.

4. The OLED display panel according to claim 1, wherein the auxiliary electrode comprises a plurality of discrete sub-auxiliary electrodes.

5. The OLED display panel according to claim 4, wherein the first length is greater than a sum of a length of the sub-auxiliary electrode and a distance between adjacent sub-auxiliary electrodes.

6. The OLED display panel according to claim 4, wherein distances between respective adjacent sub-auxiliary electrodes of the auxiliary electrode decrease along a direction from the signal input terminal.

7. The OLED display panel according to claim 4, wherein the OLED display panel comprises a plurality of pixel units, and a length of the sub-auxiliary electrode is greater than or equal to a length of one pixel unit.

8. The OLED display panel according to claim 1, wherein a width of the auxiliary electrode increases along a direction from the signal input terminal.

9. The OLED display panel according to claim 1, wherein a resistivity of a material, of which the auxiliary electrode is made, decreases along a direction from the signal input terminal.

10. The OLED display panel according to claim 1, wherein a thickness of the auxiliary electrode increases along a direction from the signal input terminal.

11. The OLED display panel according to claim 1, further comprising:
    a first electrode, disposed above the TFT and electrically connected to the source electrode or the drain electrode;
    an organic layer, disposed above the substrate; and
    a second electrode, disposed above the substrate.

12. The OLED display panel according to claim 11, wherein the auxiliary electrode is located in a same layer as the first electrode.

13. The OLED display panel according to claim 1, wherein the auxiliary electrode and the first electrode are made of a same material.

14. The OLED display panel according to claim 1, wherein the auxiliary electrode is disposed above the power line.

15. The OLED display panel according to claim 1, wherein the auxiliary electrode is covered by a layer of an opaque material, or the auxiliary electrode is made of an opaque material.

16. An OLED display device, comprising:
    an OLED display panel, wherein the OLED display panel comprises:
        a substrate;
        a Thin-film Transistor (TFT) disposed on the substrate, the TFT comprising:
            a source electrode, and
            a drain electrode;
        a power line, disposed above the substrate;
        an auxiliary electrode electrically connected to the power line; and a signal input terminal, electrically connected to the power line and providing an input signal, wherein a first collective portion of the auxiliary electrode and the power line has a first length and a first resistance, wherein a second collective portion of the auxiliary electrode and the power line has a second length and a second resistance, wherein the first collective portion is between the second collective portion and the signal input terminal, wherein the first length is equal to the second length, and wherein the first resistance is greater than the second resistance.

17. A method for fabricating an OLED display panel, wherein the method comprises:

providing a substrate;

forming, above the substrate, a TFT comprising a source electrode and a drain electrode;

forming a power line above the substrate;

forming a first electrode above the TFT, the first electrode being electrically connected to the source electrode or the drain electrode;

forming an auxiliary electrode, wherein a resistance per unit length of the auxiliary electrode changes along the auxiliary electrode and the auxiliary electrode is electrically connected to the power line;

forming an organic layer above the first electrode; and forming a second electrode above the organic layer, wherein the OLED display panel further comprises a signal input terminal electrically connected to the power line, a first collective portion of the auxiliary electrode and the power line has a first length and a first resistance, a second collective portion of the auxiliary electrode and the power line has a second length and a second resistance, the first collective portion is between the second collective portion and the signal input terminal, the first length is equal to the second length, and the first resistance is greater than the second resistance.

18. The method according to claim 17, wherein the auxiliary electrode is formed in a same layer as the first electrode.

19. The method according to claim 17, wherein the auxiliary electrode and the first electrode are formed in a same step.

\* \* \* \* \*